US011670662B2

(12) United States Patent
Lee et al.

(10) Patent No.: US 11,670,662 B2
(45) Date of Patent: Jun. 6, 2023

(54) SEMICONDUCTOR SUBSTRATE WITH PASSIVATED FULL DEEP-TRENCH ISOLATION AND ASSOCIATED METHODS OF MANUFACTURE

(71) Applicant: OmniVision Technologies, Inc., Santa Clara, CA (US)

(72) Inventors: Cynthia Sun Yee Lee, Santa Clara, CA (US); Shiyu Sun, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 110 days.

(21) Appl. No.: 17/133,553

(22) Filed: Dec. 23, 2020

(65) Prior Publication Data

US 2022/0199658 A1 Jun. 23, 2022

(51) Int. Cl.
*H01L 27/146* (2006.01)

(52) U.S. Cl.
CPC ...... *H01L 27/1463* (2013.01); *H01L 27/1462* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| 7,800,192 | B2 | 9/2010 | Venezia et al. |
| 10,115,759 | B2 | 10/2018 | Lee et al. |
| 10,263,021 | B2 | 4/2019 | Raynor |
| 11,264,421 | B2* | 3/2022 | Ge .................. H01L 27/1464 |
| 2013/0075607 | A1* | 3/2013 | Bikumandla ..... H01L 27/14634 257/E31.127 |
| 2016/0099266 | A1* | 4/2016 | Zheng .............. H01L 27/14645 438/70 |
| 2017/0062496 | A1* | 3/2017 | Lai ................... H01L 27/1464 |
| 2018/0040661 | A1* | 2/2018 | Lee ................... H01L 27/1462 |
| 2020/0020725 | A1* | 1/2020 | Tsai ................ H01L 27/14685 |

* cited by examiner

*Primary Examiner* — Ali Naraghi
(74) *Attorney, Agent, or Firm* — Cozen O'Connor (57) ABSTRACT

An image sensor with passivated full deep-trench isolation includes a semiconductor substrate, the substrate including a plurality of sidewalls that form a plurality of trenches that separates pixels of a pixel array, and a passivation layer lining the plurality of sidewall surfaces and the back surface of the semiconductor substrate. A method for forming an image sensor with passivated full deep-trench isolation includes forming trenches in a semiconductor substrate, filling the trenches with a sacrificial material, forming a plurality of photodiode regions, forming a circuit layer, thinning the semiconductor substrate, and removing the sacrificial material. A method for reducing noise in an image sensor includes removing material from a semiconductor substrate to form a plurality of trenches that extend from a front surface toward a back surface, and depositing a dielectric material onto the back surface and into the plurality of trenches through a back opening of each trench.

14 Claims, 11 Drawing Sheets

BLOCK 712

BLOCK 714

1310
REMOVE MATERIAL FROM A SEMICONDUCTOR SUBSTRATE FROM A FRONT SURFACE TO FORM A PLURALITY OF TRENCHES THAT EXTENDS INTO THE SEMICONDUCTOR SUBSTRATE TOWARD A BACK SURFACE OF THE SEMICONDUCTOR SUBSTRATE.

1320
DEPOSIT A DIELECTRIC MATERIAL ONTO THE BACK SURFACE AND INTO THE PLURALITY OF TRENCHES THROUGH A BACK OPENING OF EACH OF THE PLURALITY OF TRENCHES TO LINE SAID EACH TRENCH OF THE PLURALITY OF TRENCHES, THE BACK OPENING PROXIMATE TO THE BACK SURFACE.

1322
DEPOSIT A HIGH-K DIELECTRIC MATERIAL.

1324
DEPOSIT A SECOND DIELECTRIC MATERIAL ONTO THE BACK SURFACE AND INTO THE PLURALITY OF TRENCHES THROUGH THE BACK OPENING OF EACH OF THE PLURALITY OF TRENCHES FORMING AN ANTI-REFLECTION LAYER.

1326
DEPOSIT A FILLING MATERIAL INTO EACH OF THE PLURALITY OF TRENCHES THROUGH THE BACK OPENING.

*FIG. 13*

SEMICONDUCTOR SUBSTRATE WITH PASSIVATED FULL DEEP-TRENCH ISOLATION AND ASSOCIATED METHODS OF MANUFACTURE

BACKGROUND

Camera modules in commercial products such as stand-alone digital cameras, mobile devices, automotive components, and medical devices include an image sensor. The image sensor includes a semiconductor substrate that includes a pixel array. In practice, electrical leakage current flows between regions of the semiconductor substrate and between pixels, which causes unwanted effects such as noise that reduces image quality and reduced functionality of the image sensor. To reduce noise, pixels are separated from their adjacent pixels by trench isolation structures, which may include depositions of dielectric materials such as oxide material to provide electrical isolation between individual pixels.

SUMMARY OF THE INVENTION

Semiconductors substrates, like those used in image sensors, can conduct electrical current. During operation of an image sensor, current that flows between pixels can lead to noise that thereby reduces image quality and/or resolution of the image sensor. Deep trench isolation (DTI) is used to reduce the flow of current between pixels by physically removing semiconductor substrate material between pixels to form a trench, which may be lined and/or filled with materials to further prevent current from traversing the trench. The effectiveness of DTI depends on the trench depth, where deeper trenches exhibit better electrical and/or optical isolation. So-called full DTI describes forming a trench that extends the full thickness of the semiconductor substrate, which is generally more effective than partial DTI, which is less effective but may be simpler or cheaper to fabricate. The trenches of full DTI are what could be called through-trenches since each extends fully through the substrate rather than terminating at a point within the substrate. By analogy, a through-hole extends through a material, which contrasts to a blind hole, which terminates within the material. In practice, the process of forming DTI has certain limitations that complicate the process and may lead to increased cost and decreased electrical isolation.

One method of forming full DTI trenches into semiconductor substrates includes removing material from the backside of the substrate. When forming trenches from the backside, material is generally removed after completion of frontside process e.g. formation of photodiode regions into the semiconductor substrate and formation of the frontside circuitry on the frontside of semiconductor substrate. Thus, when removing material from the backside, it is possible to penetrate too far into the semiconductor substrate and remove material from the frontside circuitry, which causes damage to frontside circuitry resulting in malfunction of image sensor. Processes used to remove material, e.g. etching, leads to some variation in trench depth and in order to form full depth trenches for all trenches it is impossible to prevent damage to already formed frontside elements.

Another method of forming full DTI trenches is by removing semiconductor substrate material from the frontside. In this case, the formation of the trenches is simplified since the tolerance for trench depth is relaxed compared to the corresponding backside processes. Trenches formed deeper do not damage functional elements of the image sensor. However, the process of passivating the trench surface by implantation is more challenging for frontside formation due to high trench aspect ratio (aspect ratio defined as trench depth:trench width), for example trenches with aspect ratio greater than 5:1, which leads to poor implantation and insufficient passivation to deep trench surfaces. The process of forming the trench by plasma etching induces defects on semiconductor substrate surface surrounding the trench creating trap sites. As such, insufficient passivation would lead to dark currents that cause noise during operation of the image sensor.

The embodiments described herein illustrate a fabrication method that overcomes the aforementioned shortcomings of both frontside full DTI formation and backside full DTI formation. It is advantageous to form the trenches from frontside such that all of the trenches are sufficiently deep to maximally isolate all pixels despite the range of trench depths that occurs within the tolerance of the fabrication process. Then, before forming the other frontside elements, a sacrificial material is deposited into the trenches to protect the trench surfaces from subsequent fabrication steps. After the completion of the frontside fabrication processes, the semiconductor substrate is thinned from the backside by removing semiconductor material to reduce the overall thickness of the substrate. When sufficient material is removed from the backside that the trenches may be accessed from the backside (that is to say that the trenches are exposed from the backside) it is possible to remove the sacrificial material, thereby exposing the trench surfaces that remain undamaged by frontside processes. In embodiments, a high-κ passivation layer can then be deposited into the trenches through the backside openings, forming a continuous layer that coats the full depth of the trench surfaces and the backside of the substrate. In embodiments materials may be further deposited to form an anti-reflective coating. The trenches may subsequently be filled with dielectric material to form full DTI structures. The remaining fabrication steps can then be administered, such as deposition of color filters, metal grids, and arrays of microlenses.

An image sensor with passivated full deep-trench isolation includes a semiconductor substrate including a pixel array and having a front surface and a back surface that is opposite the front surface and is separated by a substrate thickness; wherein the semiconductor substrate has a plurality of sidewall surfaces that form, in the semiconductor substrate within the pixel array, a plurality of trenches, each pair of adjacent pixels of the pixel array separated by a trench of the plurality of trenches, each of the plurality of trenches extending substantially perpendicular to and away from the front surface and into the semiconductor substrate a distance equal to the substrate thickness; and a passivation layer continuously lining the back surface and the plurality of sidewall surfaces.

A method for forming an image sensor with passivated full deep-trench isolation includes forming a plurality of trenches in a front surface of a semiconductor substrate, each of the plurality of trenches having a trench depth; filling the plurality of trenches with a sacrificial material; forming a plurality of photodiode regions in the semiconductor substrate, each pair of adjacent photodiode regions being separated by a trench of the plurality of trenches; forming a circuit layer disposed on the front surface of the semiconductor substrate; and thinning the semiconductor substrate by removing material from a back surface of the semiconductor substrate until the semiconductor substrate has a thickness less than the trench depth, the back surface being opposite the front surface; and removing the sacrificial material.

A method for reducing noise in an image sensor includes removing material from a semiconductor substrate from a front surface to form a plurality of trenches that extends into the semiconductor substrate toward a back surface of the semiconductor substrate; and depositing a dielectric material onto the back surface and into the plurality of trenches through a back opening of each of the plurality of trenches to line said each trench of the plurality of trenches, the back opening proximate to the back surface.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

Additionally, it will also be understood that when a layer is referred to as being "between" two layers, it can be the only layer between the two layers, or one or more intervening layers may also be present. Similarly, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

In the present disclosure, the terms "semiconductor substrate" or "substrate" refer to any type of substrate used for forming semiconductor devices thereon, including single crystal substrates, silicon, silicon-germanium, germanium, gallium arsenide semiconductor on insulator (SOI) substrates, and the combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
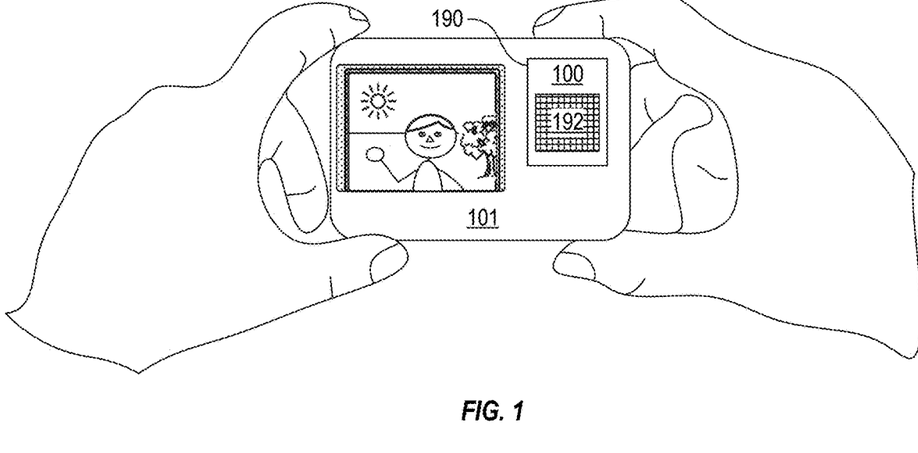
FIG. 1 depicts a camera imaging a scene, the camera includes an image sensor that includes a semiconductor substrate, according to an embodiment.

FIG. 1 depicts a camera 101 imaging a scene. Camera 101 includes an image sensor 190 that includes a semiconductor substrate 100. Constituent elements of semiconductor substrate 100 may include at least one of silicon and germanium. Semiconductor substrate 100 includes a pixel array 192. Image sensor 190 may part of a chip-scale package or a chip-on-board package.

Figure 2A:
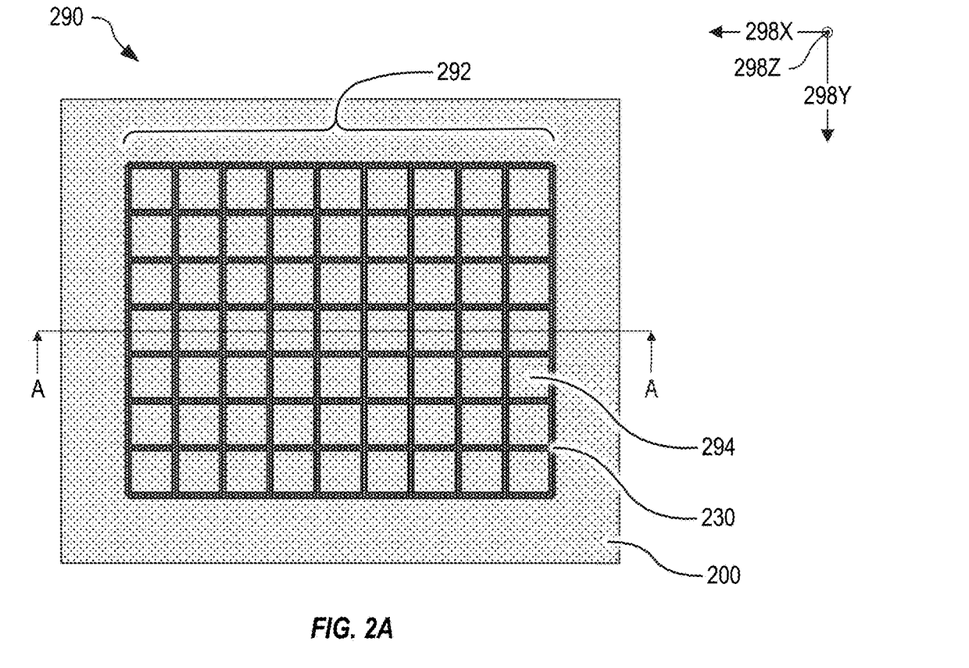
FIG. 2A and FIG. 2B illustrate two cross-sectional views of an image sensor with semiconductor substrate, which are respective examples of image sensor and semiconductor substrate of FIG. 1, according to an embodiment.
Figure 2B:
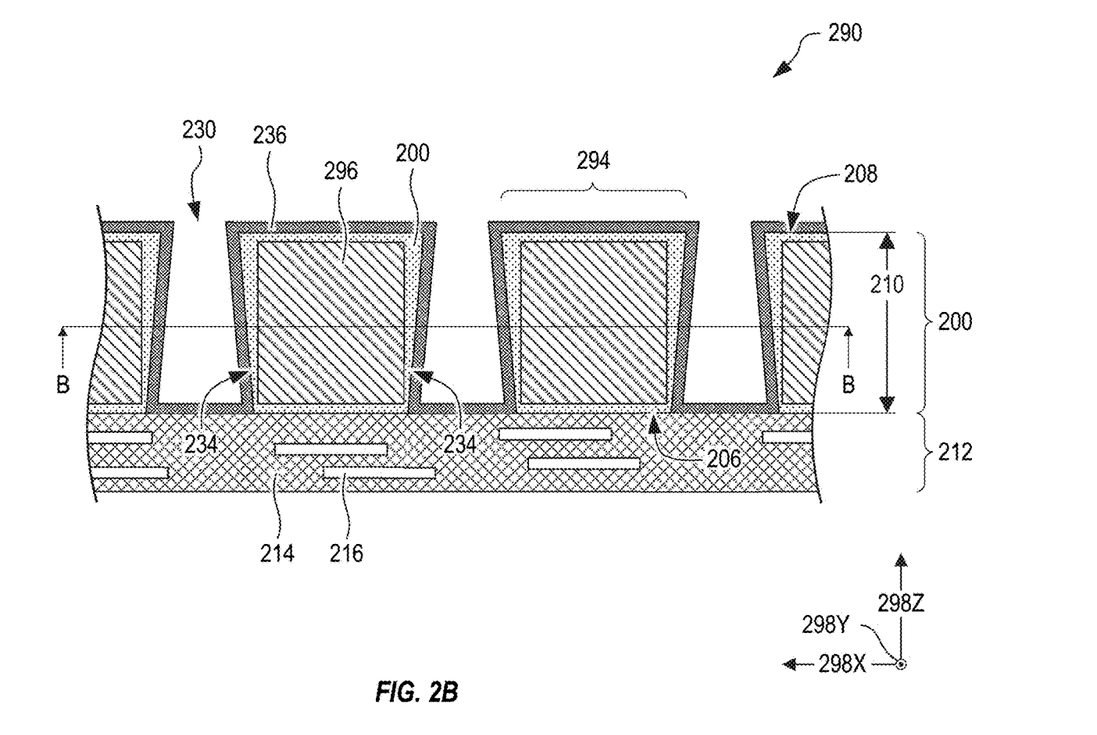

FIG. 2A and FIG. 2B illustrate two cross-sectional views of an image sensor 290 including semiconductor substrate 200, which are examples of image sensor 190 and semiconductor substrate 100, respectively. FIGS. 2A and FIG. 2B are best viewed together in the following description. The section line A-A of FIG. 2A indicates the location of the orthogonal cross section illustrated in FIG. 2B and the section line B-B of FIG. 2B indicates the location of the orthogonal cross section illustrated in FIG. 2A. The cross section illustrated in FIG. 2A is parallel to a plane, hereinafter the x-y plane, formed by orthogonal axes 298X and 298Y, which are each orthogonal to an axis 298Z. Planes parallel to the x-y plane are referred to as horizontal planes. The cross section illustrated in FIG. 2B is parallel to a plane hereinafter the x-z plane, formed by orthogonal axes 298X and 298Z. Unless otherwise specified, heights of objects herein refer to the object's extent along axis 298Z. Herein, a reference to an axis x, y, or z refers to axes 298X, 298Y, and 298Z respectively. Also, herein, a width refers to an object's extent along the x axis, and vertical refers to a direction along the z axis. Also, herein, above refers to a relative position a distance away along the axis 298Z in the positive direction and below refers to a relative position a distance away along the axis 298Z in the negative direction.

The semiconductor substrate 200 includes a pixel array 292 that contains a plurality of pixels 294. The semiconductor substrate 200 has a front surface 206 and a back surface 208 that is opposite the front surface 206 and the two are separated by a substrate thickness 210. Both the front surface 206 and the back surface 208 are parallel to the x-y plane. The semiconductor substrate 200 may include silicon, silicon-germanium, germanium, gallium arsenide, and combinations thereof. The image sensor 290 includes a circuit layer 212 disposed on the front surface 206, the circuit layer 212 includes a dielectric layer 214 in which a metal interconnection structure 216 is embedded. For clarity of illustration, only one portion of the metal interconnection structure 216 is indicated with a reference sign. Elements within the dielectric layer 214 with solid white fill schematically represent portions of the metal interconnection structure 216. The structure of metal interconnection structure 216 is representative of a generic metal interconnection structure and is not meant to limit the embodiments described herein. More or fewer metal layers may be used without departing from the scope hereof. In an embodiment, the circuit layer 212 includes a multi-layer interconnection structure 216 embedded in dielectric layer 214, which provides isolation for the metal interconnection structure 216. The circuit layer 212 may further includes polysilicon gates of transistors formed on semiconductor substrate 200 and electrical contacts to polysilicon gates of transistors and doped regions (e.g., floating diffusion regions, source/drain regions, P-well regions) formed in the semiconductor substrate 200 of transistors) for pixel signal routing.

Each pixel 294 contains a photodiode region 296 formed in the semiconductor substrate 200. Between each pair of adjacent pixels 294 is a trench of a plurality of trenches 230, which extends into the semiconductor substrate 200 a distance equal to the substrate thickness 210. The plurality of trenches 230 are interconnected form a trench grid. The semiconductor substrate 200 includes a plurality of sidewall surfaces 234 that form the plurality of trenches 230. Each of the plurality of sidewall surfaces 234 is lined with a passivation layer 236 that continuously extends onto the back surface 208 and onto a surface of a first inter-layer dielectric layer of the circuit layer 212 exposed by the plurality of trenches 230. The passivation layer 236 lines the entirety of sidewall surfaces 234. In an embodiment, the passivation layer 236 is a high-κ material with negative fixed charges, such as aluminum oxide ($Al_2O_3$) and Hafnium oxide (HfO) that is deposited via atomic layer deposition and continuously lines the surface onto which it is deposited. The passivation layer 236 with negative fixed charges can form a hole accumulate region surrounding sidewall surfaces 234 and bottom surfaces of the plurality of trenches 230 in entirety as well as back surface 208, provide more effectively surface passivation to trap sites and/or defects that may be created at the interfaces between the plurality of trenches 230 and semiconductor substrate 200 resulting from plasma etching damage, thereby reduce dark current and light sensing operation of nearby photodiode regions 296. In addition, by depositing high-κ material from backside of the semiconductor substrate 200 to form passivation layer 236 instead of front side prevents high-κ material from being damage by high front side thermal processes, such as high temperature annealing process of activating dopant to photodiode, sources/drains of transistors and doped polysilicon gates of transistors. In an embodiment the passivation layer 236 has a thickness between 50 and 150 angstroms. In an embodiment, each of the plurality of trenches 230 has a trapezoidal shape with the width decreasing with increasing distance from the front surface 206 toward back surface 208. In an embodiment, each trench 230 has an aspect ratio between 12.5:1 and 20:1, though the aspect ratio of each trench 230 may vary without departing from the scope herein. In an embodiment, the width proximate the front surface 206 is between 120 and 150 nanometers and the width proximate the back surface 208 is between 50 and 80 nanometers. The view illustrated in FIG. 2B shows a cross section parallel to the x axis and is representative of any cross-section through rows of pixels 294 shown in FIG. 2A. Further, the descriptions above are similarly true for a cross-sectional side view through any column of pixels 294 along the y axis as well. FIGS. 2A and 2B each include indication of the three orthogonal axes 298X, 298Y, and 298Z as they relate to the cross-sectional side views shown.

Figure 3:
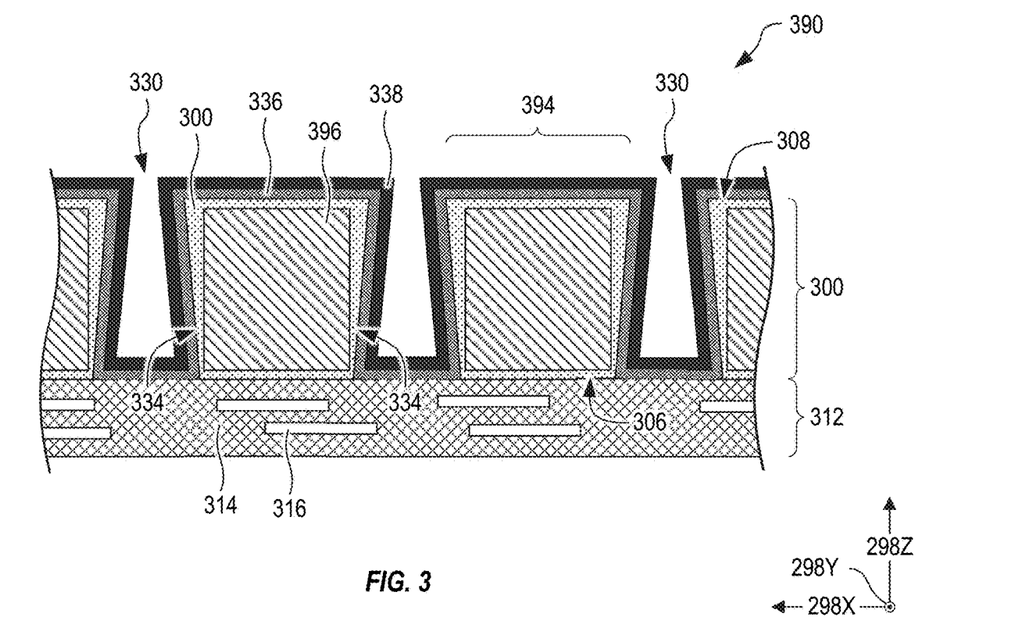
FIG. 3 illustrates a cross-sectional view of an image sensor with an anti-reflective coating thereon, the image sensor is an example of the image sensor of FIG. 1, according to an embodiment.

FIG. 3 illustrates a cross-sectional view of an image sensor 390 that includes a semiconductor substrate 300 with an anti-reflective coating 338 thereon. The image sensor 390 is an example of the image sensor 190. The semiconductor substrate 300 contains similar elements to that shown in FIGS. 2A and 2B but includes the anti-reflective coating 338 that lines a plurality of sidewall surfaces 334 and a back surface 308 of the semiconductor substrate 300. In an embodiment, the anti-reflective coating 338 also lines a surface (a surface of a first inter-layer dielectric layer) of the circuit layer 312 exposed by the plurality of trenches 330. In an embodiment, the anti-reflective coating 338 is formed of tantalum oxide ($Ta_2O_5$), though other materials may be used without departing from the scope herein. The anti-reflective layer 338 can be a single layer or a multiple-layer stack depending on the required optical performance to maximize transmittance and reduce reflection. The anti-reflective coating 338 reduces the transmission of electromagnetic energy into and out of semiconductor substrate 300 through the plurality of sidewall surfaces 334, thereby reducing noise during operation of the image sensor 390. In an embodiment, the anti-reflective layer 338 has a thickness that ranges from 30 to 70 nanometers. The anti-reflective layer can be tantalum oxide, silicon nitride, silicon oxide, hafnium oxide, or combination of multiple films. FIG. 3 includes indication of the three orthogonal axes 298X, 298Y, and 298Z as they relate to the cross-sectional side view shown.

The semiconductor substrate 300, front surface 306, back surface 308, circuit layer 312, a dielectric layer 314, a metal interconnection structure 316, plurality of trenches 330, plurality of sidewall surfaces 334, a passivation layer 336, and a photodiode region 396 are respective examples of semiconductor substrate 200, front surface 206, back surface 208, circuit layer 212, dielectric layer 214, metal interconnection structure 216, plurality of trenches 230, plurality of sidewall surfaces 234, passivation layer 236, and photodiode region 296 of FIGS. 2A and 2B and the descriptions of each respective element apply between the two figures.

Figure 4:
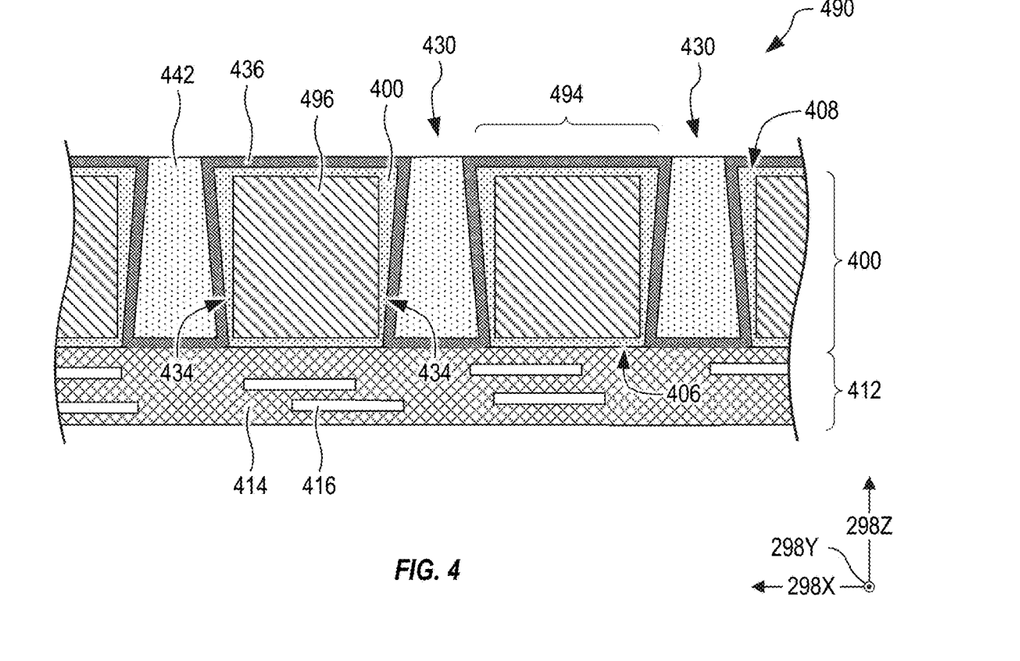
FIG. 4 illustrates a cross-sectional view of an image sensor containing a fill material in each of a plurality of trenches therein, the image sensor is an example of the image sensor of FIG. 1, according to an embodiment.

FIG. 4 illustrates a cross-sectional view of an image sensor 490 containing a fill material 442 in each of a plurality of trenches 430. The image sensor 490 is an example of the image sensor 190. In an embodiment, fill material 442 is a dielectric material (e.g. SiO$_2$) that reduces the flow of leakage electric current between any pair of adjacent pixels 494 providing electrical and/or optical isolation, thereby reducing noise during operation of the image sensor 490. In an embodiment, fill material 442 is a low refractive index dielectric material, i.e., having a refractive index lower than the semiconductor substrate 400. In an embodiment, the fill material 442 is a conductive material chosen from aluminum, tungsten, silver, and an alloy of aluminum tungsten and silver. In an embodiment, the fill material 442 is metallic and reflects incident light to increase potential absorption by the photodiode region 496, thereby increasing the sensitivity of the pixel 494. In an embodiment, the fill material 442 is conductive (e.g. metallic or polysilicon) and can be negative biased to form a hole accumulation region providing passivation for trench side wall 434 and bottom surface that may have defects resulting from plasma etching that may otherwise cause a dark current that contributes to noise. FIG. 4 includes indication of the three orthogonal axes 298X, 298Y, and 298Z as they relate to the cross-sectional side view shown.

The semiconductor substrate 400, a front surface 406, a back surface 408, a circuit layer 412, a dielectric layer 414, a metal interconnection structure 416, plurality of trenches 430, a plurality of sidewall surfaces 434, a passivation layer 436, and a photodiode region 496 are respectively examples of semiconductor substrate 200, front surface 206, back surface 208, circuit layer 212, dielectric layer 214, metal interconnection structure 216, plurality of trenches 230, plurality of sidewall surfaces 234, passivation layer 236, and photodiode region 296 of FIGS. 2A and 2B and the descriptions of each respective element apply between the two figures.

Figure 5:
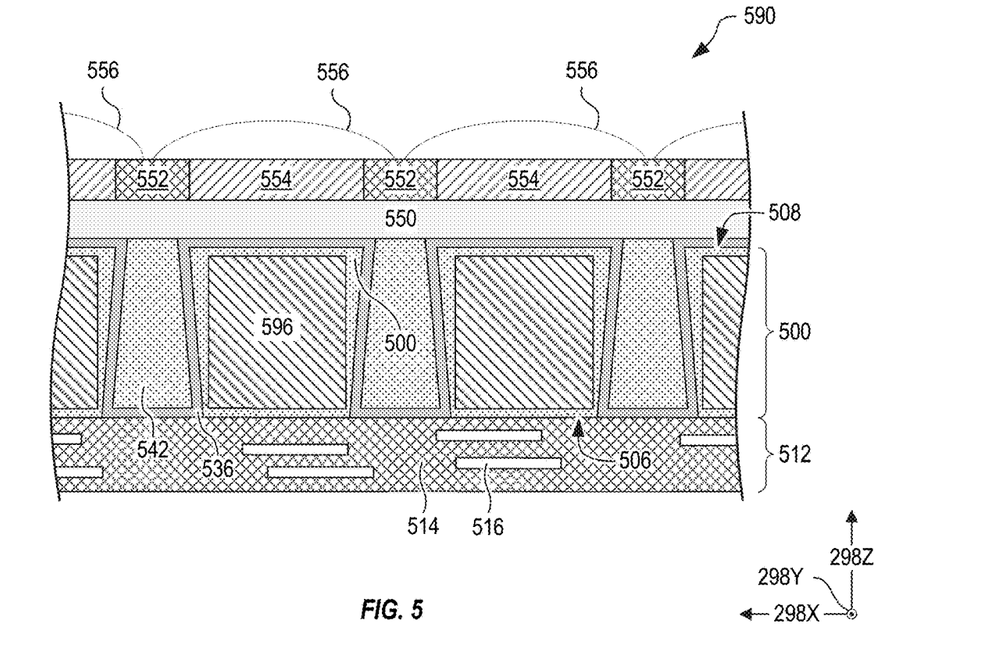
FIG. 5 illustrates a cross-sectional view of an image sensor with buffer layer, metal grid, color filter array, and microlens array, the image sensor is an example of the image sensor of FIG. 1, according to an embodiment.

FIG. 5 illustrates a cross-sectional view of an image sensor 590 with a buffer layer 550, a metal grid 552 containing a plurality of interconnected metal grid structures or metal segments, a color filter array 554, and a microlens array 556. The image sensor 590 is an example of the image sensor 190. The plurality of metal segments interconnected defining apertures above photodiode regions 596. In an embodiment, the buffer layer 550 is disposed on a back surface 508 of a semiconductor substrate 500 and the metal grid 552 and color filter array 554 are disposed on the buffer layer 550, with the metal grid 552 aligned above a fill material 542 deposited into each of a plurality of trenches 530, each color filter of the color filter array 554 above a photodiode region of a plurality of photodiode regions 596. In an embodiment, each of metal grid structures vertically aligned with each respective deep trench isolation structures. In embodiments, metal grid 552 is optically aligned with the plurality of photodiode regions 596. In an embodiments, each color filter of color filter array 554 is surrounded by the metal grid 552. In an embodiment, the color filter array 554 is a Bayer filter mosaic color filter array. In an embodiment, the color filter array 554 includes red green and blue filters arranged based on Bayer color pattern. In an embodiment, the color filter array 554 includes red, green, blue, and infrared filters. Above the metal grid 552 and color filter array 554 is the microlens array 556, with each microlens of the microlens array aligned above a photodiode region of the plurality of photodiode regions 596. FIG. 5 includes indication of the three orthogonal axes 298X, 298Y, and 298Z as they relate to the cross-sectional side view shown.

The semiconductor substrate 500, a front surface 506, back surface 508, a circuit layer 512, a dielectric layer 514, a metal interconnection structure 516, plurality of trenches 530, a plurality of sidewall surfaces 534, a passivation layer 536, and photodiode region 596 are respectively examples of semiconductor substrate 200, front surface 206, back surface 208, circuit layer 212, dielectric layer 214, metal interconnection structure 216, plurality of trenches 230, plurality of sidewall surfaces 234, passivation layer 236, and photodiode region 296 of FIGS. 2A and 2B and the descriptions of each respective element apply between the two figures.

Figure 6:
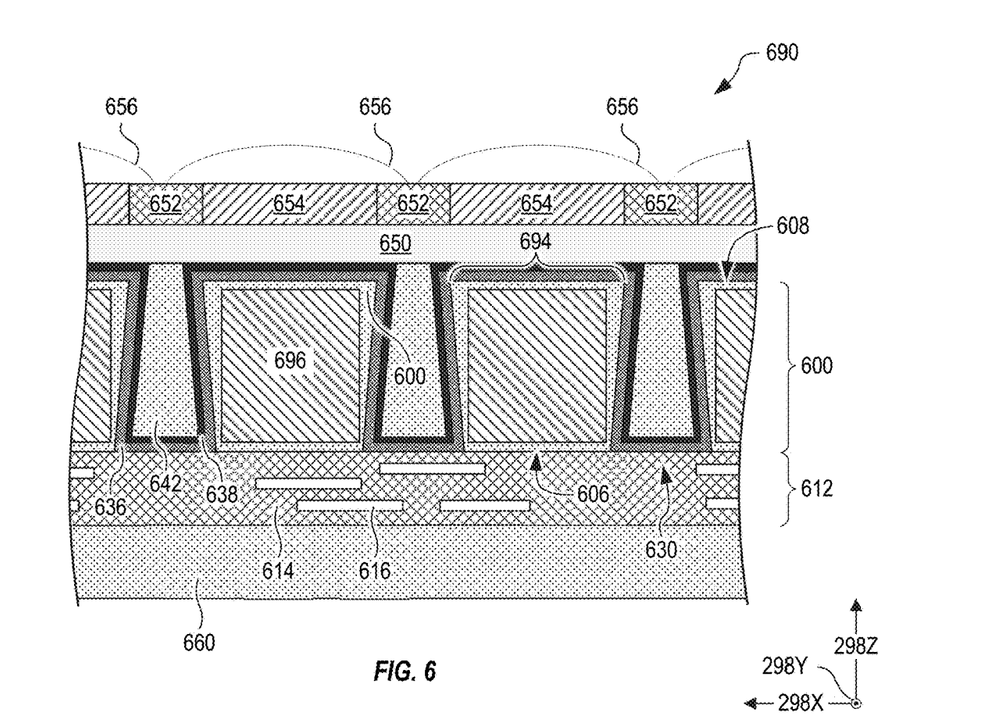
FIG. 6 illustrates a cross-sectional view of an image sensor with a logic wafer bound to a circuit layer disposed on a front surface of a semiconductor substrate, the image sensor is an example of image sensor of FIG. 1, according to an embodiment.

FIG. 6 illustrate a cross-sectional view of an image sensor 690 with a logic wafer 660 bound to a circuit layer 612 disposed on a front surface 606 of a semiconductor substrate 600. The image sensor 690 is an example of image sensor 190. In embodiments, logic wafer 660 is be an application specific integrated circuit (ASIC) and includes logic circuitry for controlling the operation of image sensor 690 and for receiving image date from image sensor 660. In embodiments, logic wafer 690 is bonded to image sensor 690 via hybrid bonding to have logic circuitry electrically connected to the circuitry of the image sensor 690 with connection formed between connected metal bonding pad at bonding interface. Image sensor 690 includes a semiconductor substrate 600 that contains a pixel array (not shown) with a plurality of pixels 694, each of which contains a photodiode region 696 and is separated from its adjacent pixels 694 by a trench 630 that is filled with a fill material 642. Trench 630 and fill material 642 form pixel isolation structure and provide electrical and/or optical isolation between adjacent pixels 694. The image sensor 690 includes an anti-reflective coating 638 as well as a buffer layer 650, a metal grid 652, a color filter array 654, and a microlens array 656. FIG. 6 includes indication of the three orthogonal axes 298X, 298Y, and 298Z as they relate to the cross-sectional side view shown.

The semiconductor substrate 600, front surface 606, a back surface 608, circuit layer 612, a dielectric layer 614, a metal interconnection structure 616, plurality of trenches 630, a plurality of sidewall surfaces 634, passivation layer 636, image sensor 690, and photodiode region 696 are respectively examples of semiconductor substrate 200, front surface 206, back surface 208, circuit layer 212, dielectric layer 214, metal interconnection structure 216, plurality of trenches 230, plurality of sidewall surfaces 234, passivation layer 236, image sensor 290, and photodiode region 296 of FIGS. 2A and 2B and the descriptions of each respective element apply between the two figures.

Figure 7:
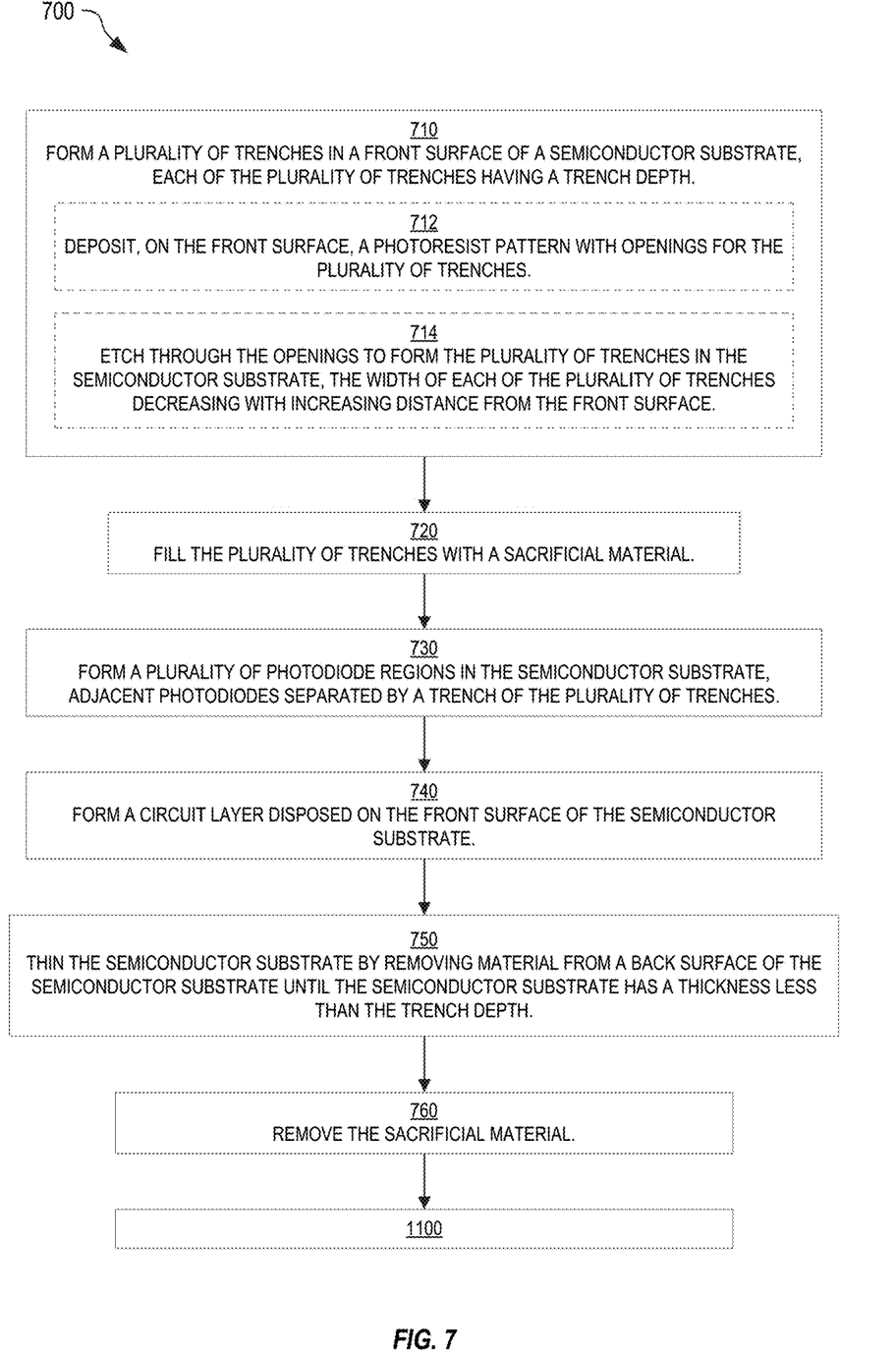
FIG. 7 shows a flowchart illustrating a method for manufacturing the semiconductor substrate of FIG. 1 with passivated full deep-trench isolation, according to an embodiment.
Figure 11:
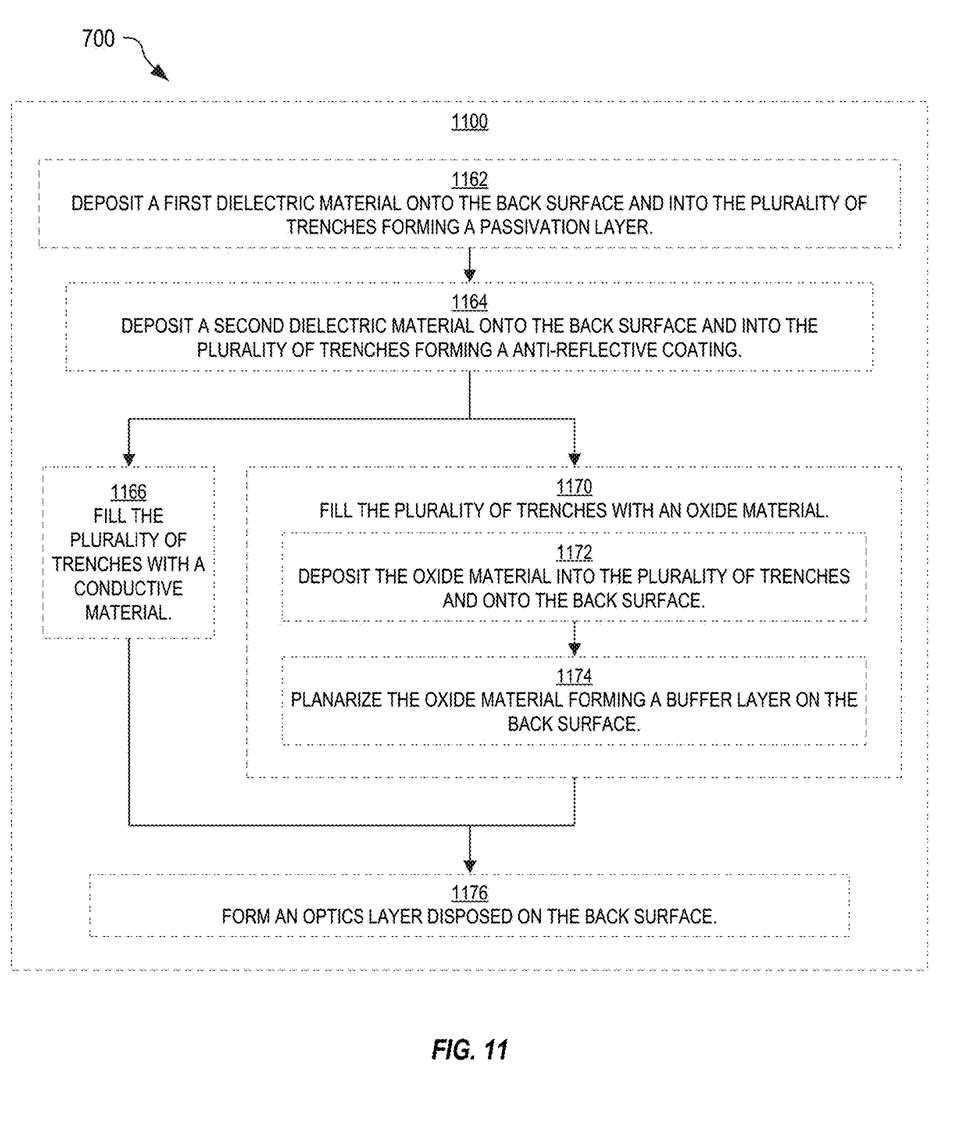
FIG. 11 shows a flowchart illustrating additional blocks of the method of FIG. 7 for manufacturing the semiconductor substrate of FIG. 1 with passivated full deep-trench isolation, according to an embodiment.

FIGS. 7 and 11 show a flowchart illustrating a method 700 for forming a semiconductor substrate with passivated deep-trench isolation. Method 700 may be used in conjunction with any of semiconductor substrates 100, 200, 300, 400, 500, or 600. Method 700 includes blocks 710, 720, 730, 740, 750, and 760. In embodiments, method 700 also includes at least one of blocks 712, 704, and 1100, which includes blocks 1162, 1164, 1166, 1170, 1172, 1174, and 1176.

In block 710, a plurality of trenches is formed in a front surface of a semiconductor substrate where each of the plurality of trenches has a trench depth. In an example of block 710, the plurality of trenches 230 is formed into the front surface 208 the semiconductor substrate 200.

In block 720 of the method 700, the plurality of trenches is filled with a sacrificial material, an example of which will be discussed below with respect to FIG. 8. In an embodiment, the sacrificial material is chosen from silicon nitride (SiN) and silicon carbide (SiC) and is deposited in the trenches using chemical vapor deposition, though other deposition methods may be used without departing from the scope herein. Excess sacrificial material may be removed using chemical mechanical polishing to remove any sacrificial material deposited on the semiconductor substrate between the trenches and on other surfaces.

In block 730 of the method 700, a plurality of photodiode regions is formed in the semiconductor substrate where each pair of adjacent photodiode regions is separated by a trench of the plurality of trenches. The photodiode regions are formed by fabrication techniques known in the art such as ion implantation and annealing process. In an example of block 730, a plurality of photodiode regions 296 are formed in the semiconductor substrate 200, each separated by a trench 230. In embodiments, each of photodiode regions 296 may be of n-type (e.g., phosphorus, arsenic) doped region in a p-type (e.g., boron) doped semiconductor substrate. In embodiments, each of photodiode regions 296 may be of p-type doped region in an n-type doped semiconductor substrate. In embodiments, a p-type doped region may be implanted between each of photodiode regions 296 and the front surface to form a pinning layer for surface passivation.

Figure 8:
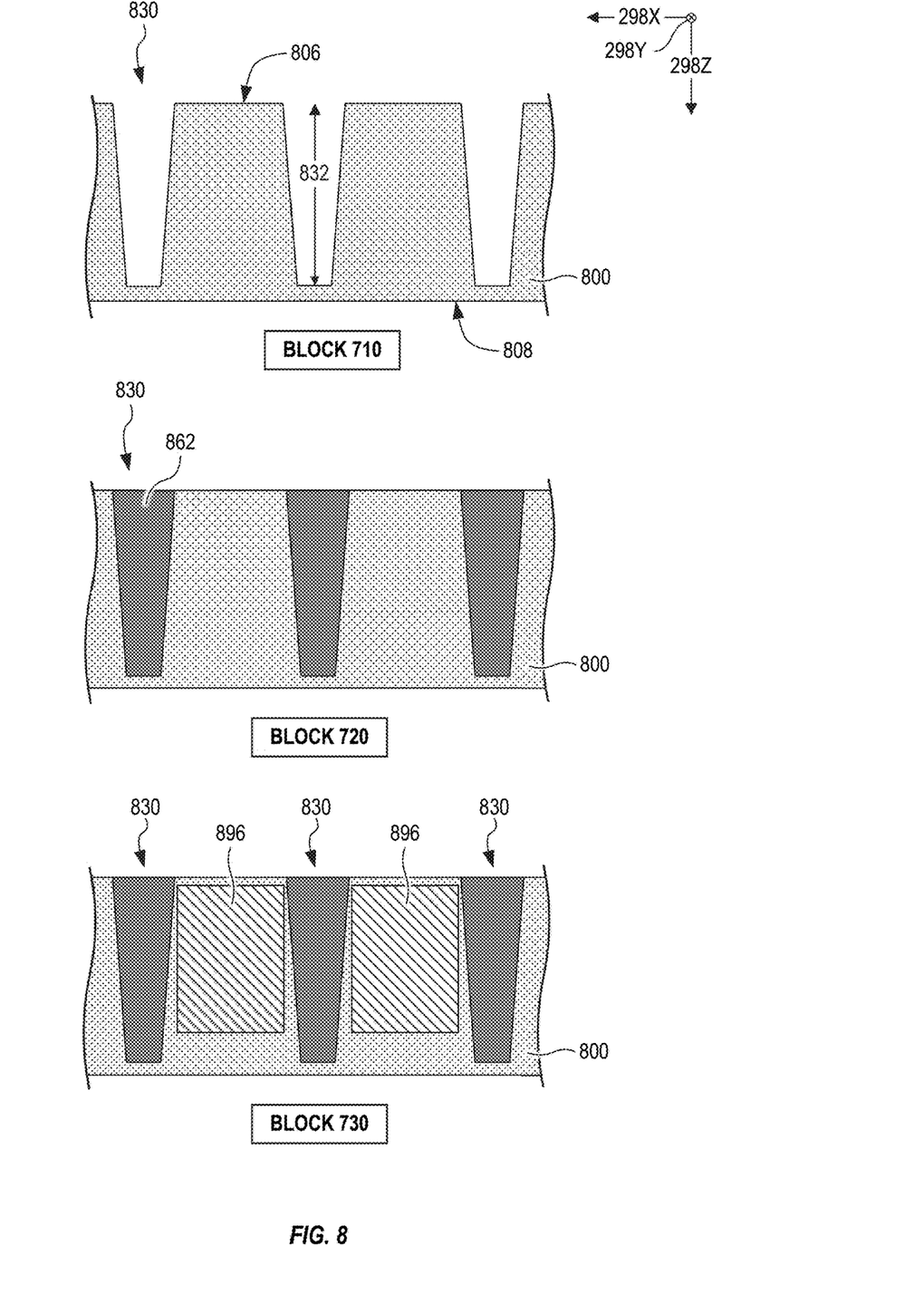
FIG. 8 shows a first series of cross-sectional side views of a semiconductor substrate to illustrate the method of FIG. 7, according to an embodiment.

FIG. 8 illustrates one example of the blocks 710, 720, and 730 of the method 700. The top drawing illustrates the result of block 710, where a plurality of trenches 830 is formed into a front surface 806 of a semiconductor substrate 800 to a trench depth 832 measured from the front surface 806. The middle drawing illustrates the result of block 720, where a sacrificial material 862 has been deposited into each of the plurality of trenches 830. In embodiment, the sacrificial material 862 completely filled each of the plurality of trenches 830 and is levelled with the front surface 806 of the semiconductor substrate 800 to facilitate subsequent processes. In embodiment, a chemical mechanical polishing (CMP) process may be applied to the front surface after deposition of sacrificial material 862. The bottom drawing of FIG. 8 illustrates the result of block 730, where a plurality of photodiode regions 896 is formed into the semiconductor substrate 800, each pair of adjacent photodiode region 896 is separated by a trench of the plurality of trenches 830. FIG. 8 includes indication of the three orthogonal axes 298X, 298Y, and 298Z as they relate to the cross-sectional side view shown in FIG. 8, which differs in orientation from those shown in FIGS. 2A through 6.

In block 740 of the method 700, a circuit layer is formed that is disposed on the front surface of the semiconductor substrate. In an example of block 740, the circuit layer 212 is disposed on the front surface 206 of the semiconductor substrate 200 of the image sensor 290 and includes a first inter-layer dielectric embedding transistor gates, spacer surround transistor gates, contacts to transistor gates and source/drain regions formed in the semiconductor substrate 200 and one or more dielectric layer 214 embedding metal interconnection structure 216.

In block 750 of the method 700, after front-end of line process, the semiconductor substrate is thinned by removing material from the back surface until the semiconductor substrate has thickness less than the trench depth. In an example of block 750, the semiconductor substrate 200 has been thinned from the back surface 208 such the substrate thickness 210 is less than the trench depth (not shown in FIG. 2). In an embodiment, the semiconductor substrate is thinned to a thickness of between 1.5 microns and 6 microns. Thinning the semiconductor substrate to a substrate thickness less than the trench depth reveals the plurality of trenches from the back surface and provides an opening so that each trench is open at both the end proximate the front surface and end proximate the back surface. In an embodiment, each trench has a trapezoidal cross-section such that the width proximate the front surface is larger than the end proximate the back surface is smaller. In an embodiment, the trench width proximate the front surface is between 120 and 150 nanometers and the trench width proximate the back surface is between 50 and 80 nanometers.

In block 760 of the method 700, the sacrificial material is removed from the plurality of trenches. In an example of block 760, a sacrificial material (not shown) has been removed from the plurality of trenches 230 of the image sensor 290. In an embodiment, the sacrificial material is removed through an opening of each trench proximate the back surface that is formed during block 750. In embodiments, etching solution such as phosphoric acid ($H_3PO_4$) with suitable or controlled formula is used to remove the sacrificial material because it dissolves SiN without disadvantageously damaging the semiconductor substrate.

Figure 9:
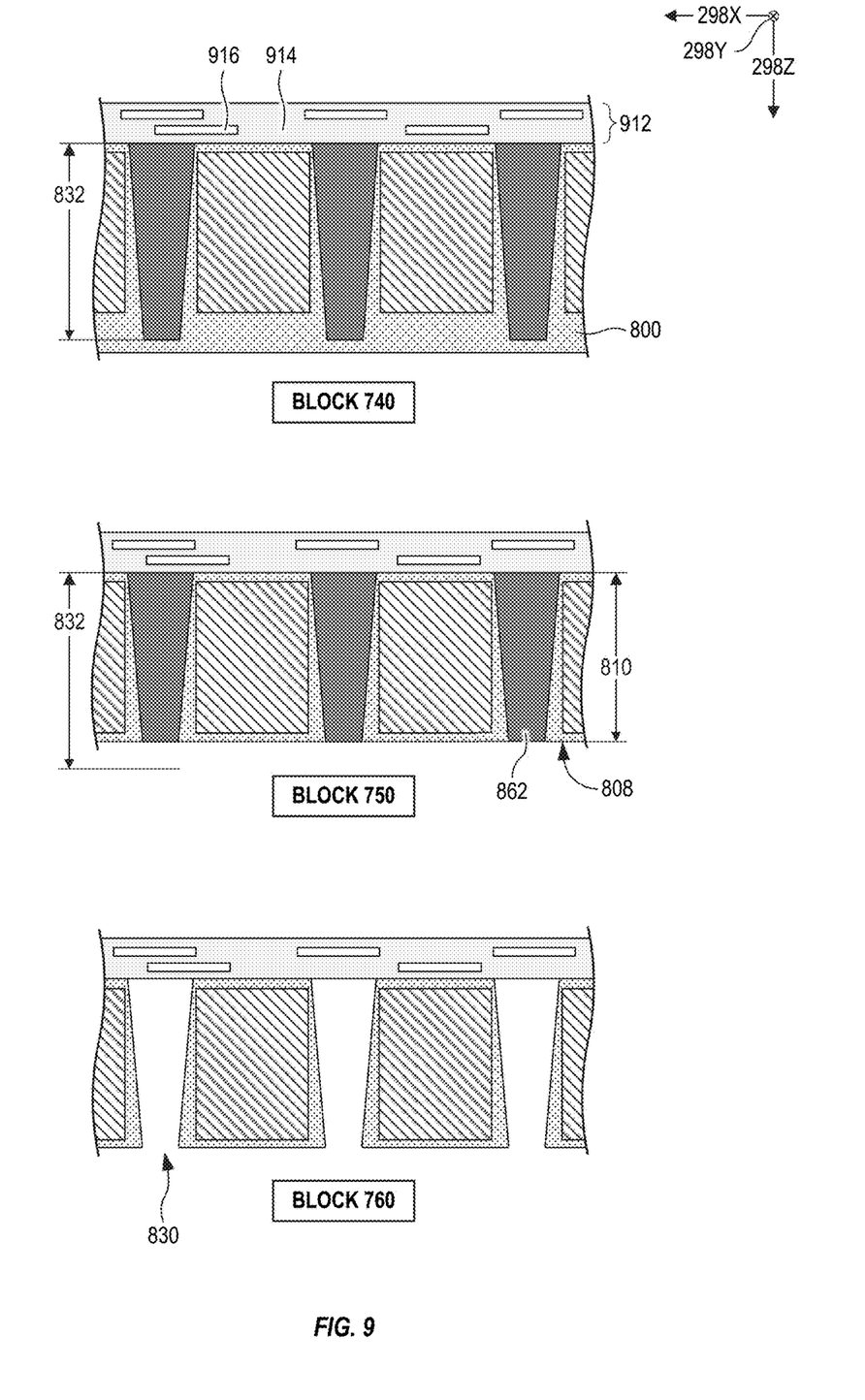
FIG. 9 shows a second series of cross-sectional side views of a semiconductor substrate to illustrate the method of FIG. 7, according to an embodiment.

FIG. 9 illustrates one example of the blocks 740, 750, and 760 of the method 700. The top drawing illustrates the result of block 740, where a circuit layer 912 is formed on the front surface 806 of the semiconductor substrate 800. The circuit layer 912 containing at least a dielectric layer 914 and a metal interconnection structure 916 embedded in the dielectric layer 914. The trench depth 832 is indicated as well. The middle drawing of FIG. 9 illustrates the results of block 750, where the semiconductor substrate 800 has been thinned by removing material from the back surface 808 until the substrate thickness 810 is less than the trench depth 832, thereby exposing each of the plurality of trenches and forming an opening of the trench proximate the back surface 808. The bottom drawing of FIG. 9 illustrates the result of block 760, which removes the sacrificial material 862 from the plurality of trenches 830. FIG. 9 includes indication of the three orthogonal axes 298X, 298Y, and 298Z as they relate to the cross-sectional side view shown in FIG. 9, which differs in orientation from those shown in FIGS. 2A through 6.

The semiconductor substrate 800, front surface 806, back surface 808, substrate thickness 810, circuit layer 912, dielectric layer 914, metal interconnection structure 916, plurality of trenches 830, plurality of photodiode regions 896 are respectively examples of the semiconductor substrate 200, front surface 206, back surface 208, substrate thickness 210, circuit layer 212, dielectric layer 214, metal interconnection structure 216, plurality of trenches 230, plurality of photodiode regions 296 of FIGS. 2A and 2B and the descriptions of each respective element apply between the two figures.

Figure 10:
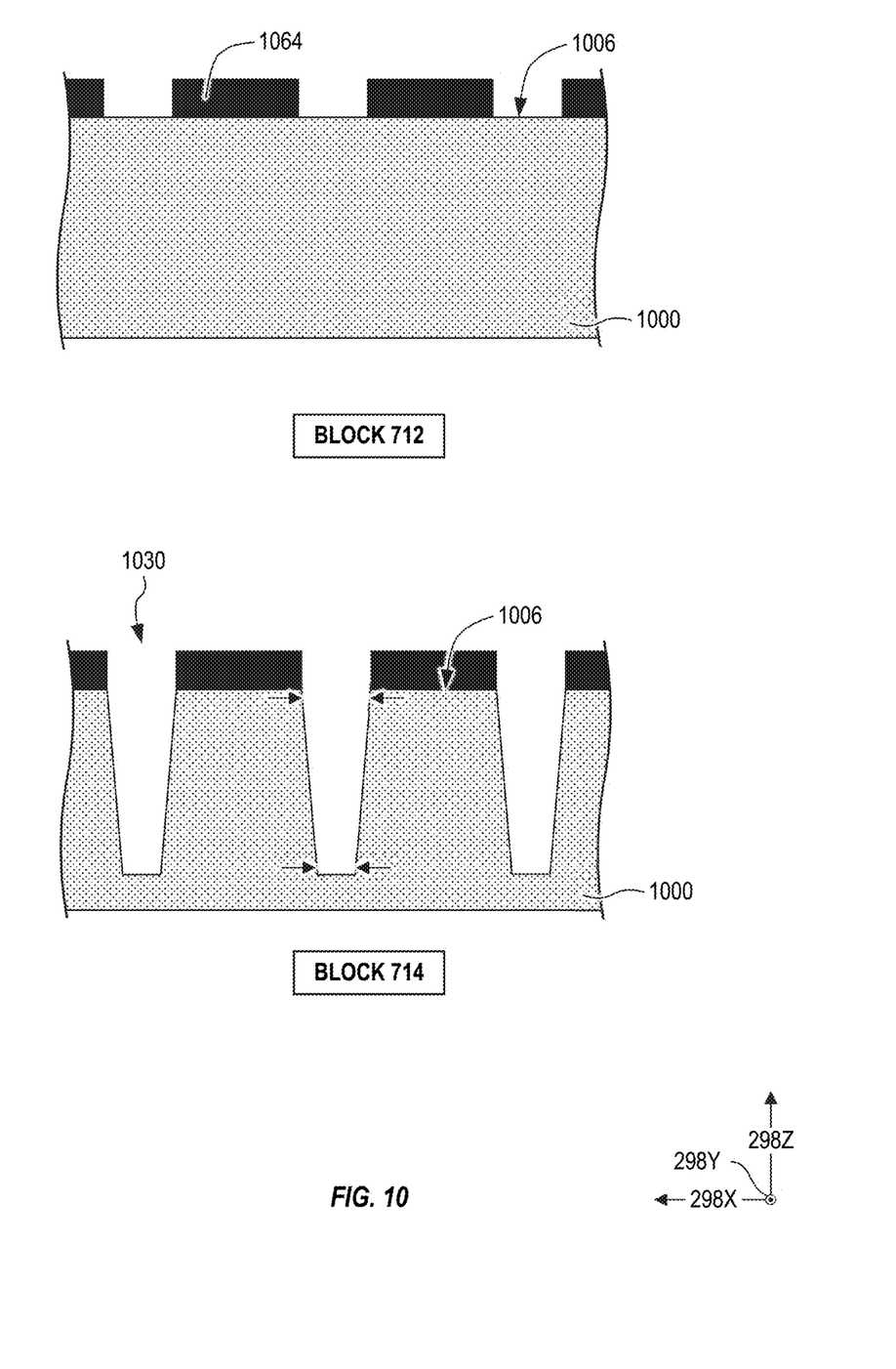
FIG. 10 shows a third series of cross-sectional side views of a semiconductor substrate to illustrate the method of FIG. 7, according to an embodiment.

In certain embodiments, the block 710 includes one or more additional blocks of the flowchart shown in FIG. 7. In block 712, a photoresist pattern with openings for the plurality of trenches is deposited on the front surface of the semiconductor substrate. In block 714, a plurality of trenches is formed in the semiconductor substrate by etching through the openings. In embodiments, each of the trenches has a trapezoidal cross section where the width of each trench decreases with increasing distance from the front surface. FIG. 10 illustrates one example of blocks 712 and 714. The top drawing of FIG. 10 illustrates the result of block 712, with a photoresist pattern 1064 deposited on a front surface 1006 of a semiconductor substrate 1000. The bottom drawing of FIG. 10 illustrates the result of block 714 that forms a plurality of trenches 1030 in the semiconductor substrate 1000 by etching through the openings of the photoresist pattern 1064, for example by plasmas etching. The width of each trench decreases with increasing distance from the front surface 1006 of the semiconductor substrate 1000. FIG. 10 includes indication of the three orthogonal axes 298X, 298Y, and 298Z as they relate to the cross-sectional side view shown in FIG. 10, which differs in orientation from those shown in FIGS. 2A through 6.

The semiconductor substrate 1000, front surface 1006, and plurality of trenches 1030 are respectively examples of the semiconductor substrate 200, front surface 806, and plurality of trenches 830 of FIGS. 2A and 2B and the descriptions of each respective element apply between the two figures.

In certain embodiments, the method 700 includes one or more additional blocks of the flowchart shown in FIGS. 7 and 11. In block 1162 of the method 700, a first dielectric material is deposited onto the back surface and into the plurality of trenches forming a passivation layer. In an example of block 1162, the passivation layer 236 has been deposited onto the back surface 208 and onto the plurality of sidewall surfaces 234 of the semiconductor substrate 200. In an embodiment, the first dielectric material is deposited through an opening of each trench proximate the back surface of the semiconductor substrate forming a continuous passivation layer lining sidewall surfaces 234 and back surface. The first dielectric material may be a high-κ material with negative fix charges, such as aluminum oxide $Al_2O_3$ and Hafnium oxide HfO.

In block 1164 of the method 700, a second dielectric material is deposited onto the back surface and into the plurality of trenches forming an anti-reflection coating. In an example of block 1164, the anti-reflective coating 338 has been deposited onto the back surface 308 and onto the plurality of sidewall surfaces 334 of the semiconductor substrate 300. In an embodiment, the second dielectric material is deposited through an opening of each trench proximate the back surface of the semiconductor substrate forming a continuous anti-reflective coating. In an embodiment, the anti-reflective coating may be single or multi-layer. In an embodiment, the anti-reflective coating may be formed of tantalum oxide ($Ta_2O_5$).

In block 1166 of the method 700, the plurality of trenches is filled with a conductive material. In an example of block 1166, the plurality of trenches 430 is filled with the fill material 442 that in an embodiment is a conductive material chosen from one or more of aluminum and tungsten. After the conductive material is deposited into the plurality of trenches, the back surface of the semiconductor substrate may receive chemical mechanical polishing and/or etching back to planarize the back surface and remove excess conductive material on the back surface for subsequent processes.

In block 1170 of the method 700, the plurality of trenches is filled with an oxide material. In an example of block 1170, the plurality of trenches 430 is filled with the fill material 442 that in an embodiment is an oxide material such as silicon oxide. In certain embodiments, the block 1170 includes blocks 1172 and 1174. In block 1172 of the method 700, the oxide material is deposited into the plurality of trenches and onto the back surface of the semiconductor substrate. In an embodiment, the oxide material is deposited using chemical vapor deposition. In block 1174 of the method 700, the oxide material is planarized to form a buffer layer on the back surface of the semiconductor substrate. In an embodiment, planarization is performed using one or both of chemical mechanical polishing and an etch-back process. In block 1176 of the method 700, an optics layer is formed disposed on the back surface. In an example of blocks 1172, 1174, and 1176, the plurality of trenches of image sensor 590 are filled with the fill material 542 that, in an embodiment, is an oxide material, and is disposed on the back surface 508 of the semiconductor substrate 500.

In an embodiment, additional buffer material (e.g., oxide-based material) is deposited on the back surface 508 of the semiconductor substrate 500 after the plurality of trenches is filled with oxide or conductive material to form a buffer layer 550 to avoid mechanical stress induced during later process, such as surface planarization by chemical polishing process, damaging underneath material layers such as passivation layer or semiconductor substrate surface that could result in dark current and white pixels. In an embodiment, an optics layer disposed on the back surface 508 and the optic layer includes metal grid 552, color filter array 554, and microlens array 556.

Figure 12:
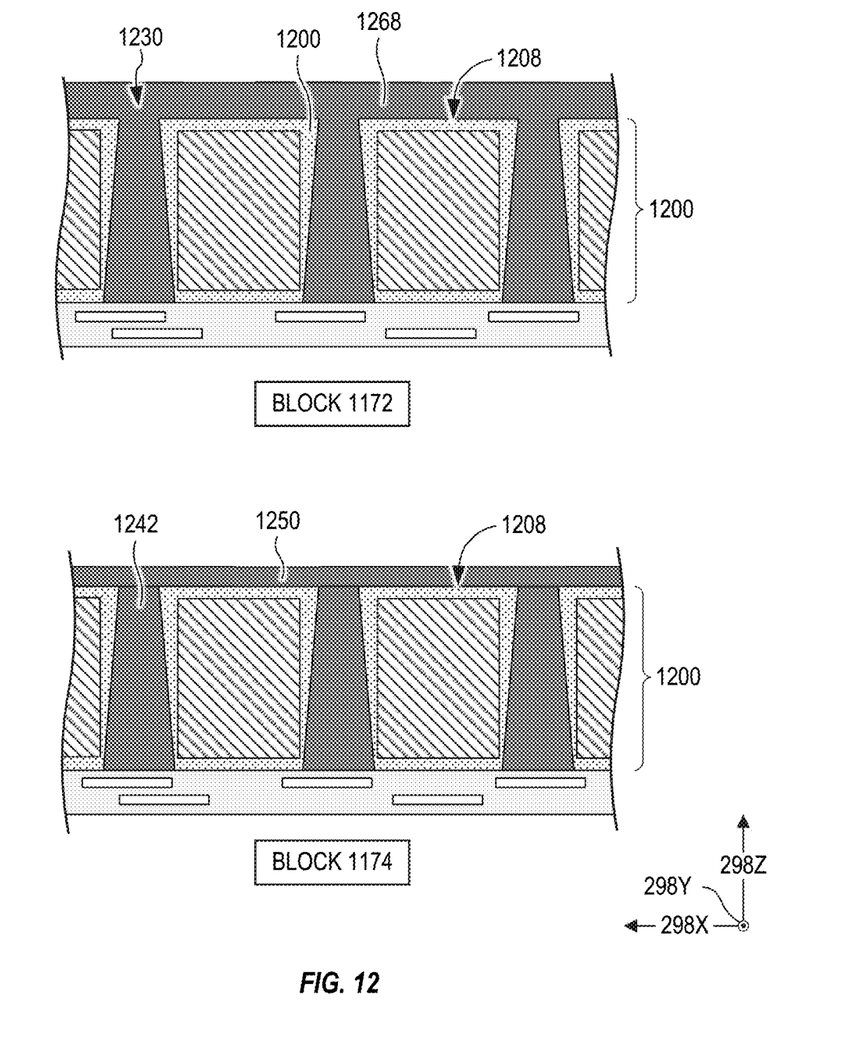
FIG. 12 shows a series of cross-sectional side views of a semiconductor substrate to illustrate the method of FIGS. 7 and 11, according to an embodiment.

FIG. 12 illustrates one example of blocks 1172 and 1174. The top drawing in FIG. 12 illustrates the result of block 1172, with an oxide material 1268 deposited in the plurality of trenches 1230 and on the back surface 1208 of the semiconductor substrate 1200. This process forms a fill material 1242 in each of the plurality of trenches 1230. The bottom drawing of FIG. 12 illustrates the result of block 1174, where the oxide material is planarized to form a buffer layer 1250 on the back surface 1208 of the semiconductor substrate 1200. In an embodiment of the image sensor 590 of FIG. 5, the fill material 542 and the buffer layer 550 are both formed from an oxide material and are thus equivalent to the fill material 1242 and buffer layer 1250 of FIG. 12. FIG. 12 includes indication of the three orthogonal axes 298X, 298Y, and 298Z as they relate to the cross-sectional side view shown, which differs in orientation from those shown in FIGS. 8 through 10.

The semiconductor substrate 1200, back surface 1208, and plurality of trenches 1230 are respectively examples of semiconductor substrate 200, back surface 208, and plurality of trenches 230 of FIGS. 2A and 2B and the descriptions of each respective element apply between the two figures. The fill material 1242 and buffer layer 1250 are respectively examples of fill material 542 and buffer layer 550 of FIG. 5 and descriptions of each respective element apply between the two figures.

Figure 13:
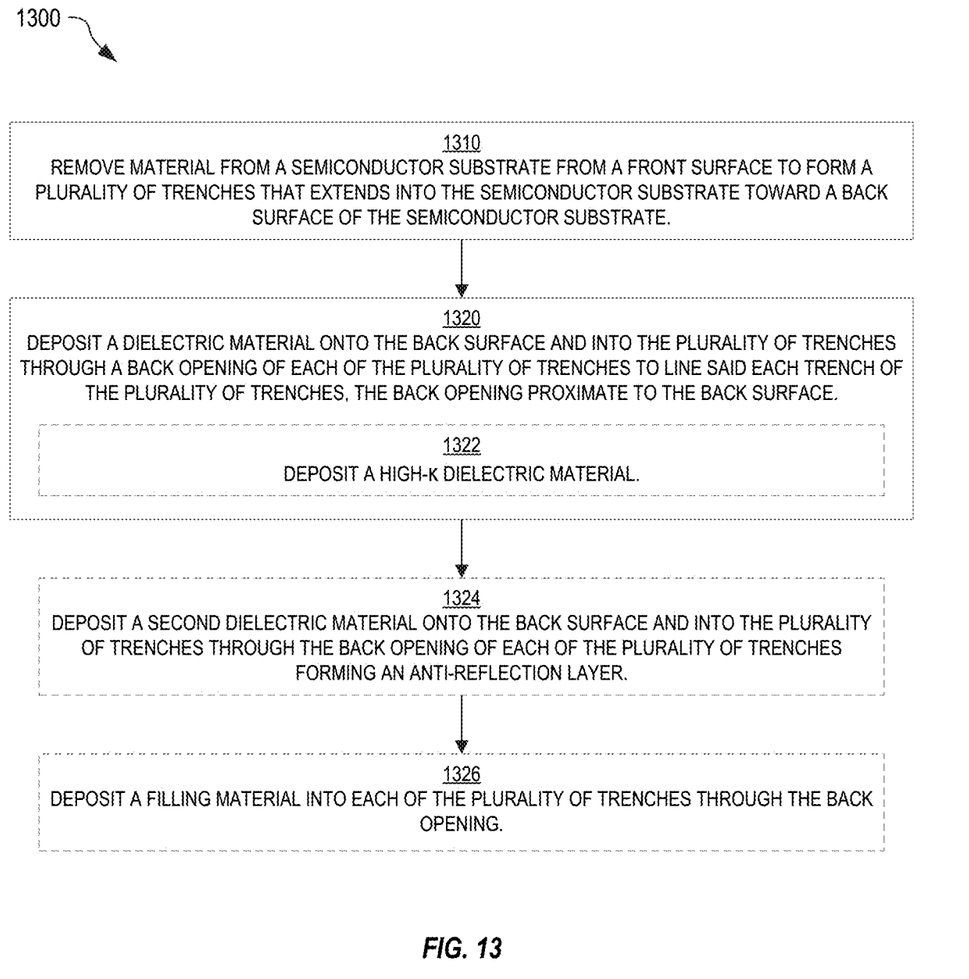
FIG. 13 shows a flowchart illustrating a method for reducing noise in an image sensor of FIG. 1, according to an embodiment.

FIG. 13 shows a flowchart illustrating a method 1300 for reducing noise in an image sensor. Method 1300 may be used in conjunction with any of semiconductor substrates 100, 200, 300, 400, 500, 600, 800, 1000, and 1200. Method 1300 includes blocks 1310 and 1320. In certain embodiments, method 1300 also includes at least one of blocks 1322, 1324, and 1326.

In block 1310 of the method 1300, material is removed from a semiconductor substrate from a front surface to form a plurality of trenches that extend into the semiconductor substrate toward a back surface of the semiconductor substrate. In an example of block 1310, the plurality of trenches 830 is formed into the front surface 806 the semiconductor substrate 800 toward the back surface 808 of FIG. 8.

In block 1320 of the method 1300, a dielectric material is deposited onto the back surface and into the plurality of trenches through a back opening of each of the plurality of trenches to line said each trench of the plurality of trenches, the back opening proximate to the back surface. In an example of block 1320, the passivation layer 236, which in an embodiment is a dielectric material, has been deposited onto the back surface 208 and continuously onto the plurality of sidewall surfaces 234 of the semiconductor substrate 200 of FIG. 2B. In certain embodiments, block 1320 includes one or more additional blocks of flowchart shown in FIG. 13. In block 1322 of the method 1300, the dielectric material is a high-κ dielectric material that reduces leakage current that can reduce the overall performance of the image sensor.

In certain embodiments, the method 1300 includes one or more additional blocks of the flowchart shown in FIG. 13. In block 1324, a second dielectric material is deposited onto the back surface and into the plurality of trenches through the back opening of each of the plurality of trenches forming an anti-reflection layer. In one example of block 1324, the anti-reflective coating 338 has been deposited onto the back surface 308 and onto the plurality of sidewall surfaces 334 of the semiconductor substrate 300 of FIG. 3.

In block 1326 of the method 1300, a filling material is deposited into each of the plurality of trenches through the back opening. In an example of block 1326, the filling material 442 has been deposited into each of the plurality of trenches 430 through an opening proximate the back surface 408 of the semiconductor substrate 400 of FIG. 4.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

COMBINATION OF FEATURES (A1) In a first aspect, a An image sensor with passivated full deep-trench isolation includes a semiconductor substrate including a pixel array and having a front surface and a back surface that is opposite the front surface and is separated by a substrate thickness; wherein the semiconductor substrate has a plurality of sidewall surfaces that form, in the semiconductor substrate within the pixel array, a plurality of trenches, each pair of adjacent pixels of the pixel array separated by a trench of the plurality of trenches, each of the plurality of trenches extending substantially perpendicular to and away from the front surface and into the semiconductor substrate a distance equal to the substrate thickness; and a passivation layer continuously lining the back surface and the plurality of sidewall surfaces.

(A2) In an embodiment of A1, each of the plurality of trenches having a front opening that is proximate to the front surface and a back opening that is proximate to the back surface, the front opening having a larger width than the back opening.

(A3) In an embodiment of either A1 or A2, the passivation layer being formed of a high-κ material and has a thickness range from 50 angstrom to 150 angstrom.

(A4) In an embodiment of any of A1 through A3, further including an anti-reflective coating disposed on the passivation layer and the anti-reflective coating continuously lining the back surface and the plurality of sidewall surfaces.

(A5) In an embodiment of any of A1 through A4, each of the plurality of trenches being filled from the back surface with a dielectric material.

(A6) In an embodiment of any of A1 through A5, each of the plurality of trenches being filled from the back surface with a conductive material.

(A7) In an embodiment of A6, the conductive material including at least one of aluminum and tungsten.

(A8) In an embodiment of any of A1 through A7, further including one or more of a buffer layer, a color-filter array, metal grid, and a microlens array disposed on the back surface.

(A9) In an embodiment of any of A1 through A8, further including a circuit layer disposed on the front surface; and a logic wafer bonded to the circuit layer.

(B1) In a second aspect, a method for forming an image sensor with passivated full deep-trench isolation includes forming a plurality of trenches in a front surface of a semiconductor substrate, each of the plurality of trenches having a trench depth; filling the plurality of trenches with a sacrificial material; forming a plurality of photodiode regions in the semiconductor substrate, each pair of adjacent photodiode regions being separated by a trench of the plurality of trenches; forming a circuit layer disposed on the front surface of the semiconductor substrate; and thinning the semiconductor substrate by removing material from a back surface of the semiconductor substrate until the semiconductor substrate has a thickness less than the trench depth, the back surface being opposite the front surface; and removing the sacrificial material.

(B2) In an embodiment of B1, further including depositing a first dielectric material onto the back surface and into the plurality of trenches forming a passivation layer.

(B3) In an embodiment of either B1 or B2, further including depositing a second dielectric material onto the back surface and into the plurality of trenches forming an anti-reflective coating.

(B4) In an embodiment of any of B1 through B3, further including filling the plurality of trenches with a conductive material, wherein the conductive material including one or more of aluminum and tungsten.

(B5) In an embodiment of any of B1 through B4, further including filling the plurality of trenches with an oxide material.

(B6) In an embodiment of B5, wherein the step of filling the plurality of trenches including depositing the oxide material into the plurality of trenches and onto the back surface; and planarizing the oxide material forming a buffer layer on the back surface.

(B7) In an embodiment of B6, further including forming an optics layer disposed on the back surface.

(B8) In an embodiment of any of B1 through B7, wherein the step of forming the plurality of trenches in the front surface of the semiconductor substrate further includes depositing, on the front surface, a photoresist pattern with a plurality of openings; and etching the semiconductor substrate through the plurality of openings to form the plurality of trenches in the semiconductor substrate, the width of each of the plurality of trenches decreasing with increasing distance from the front surface.

(C1) In a third aspect, a method for reducing noise in an image sensor includes removing material from a semiconductor substrate from a front surface to form a plurality of trenches that extends into the semiconductor substrate toward a back surface of the semiconductor substrate; and depositing a dielectric material onto the back surface and into the plurality of trenches through a back opening of each of the plurality of trenches to line said each trench of the plurality of trenches, the back opening proximate to the back surface.

(C2) In an embodiment of C1, the step of depositing further includes depositing a high-κ dielectric material.

(C3) In an embodiment of either C1 or C2, further including depositing a second dielectric material onto the back surface and into the plurality of trenches through the back opening of each of the plurality of trenches forming an anti-reflective coating.

(C4) In an embodiment of any of C1 through C3, further including depositing a filling material into each of the plurality of trenches through the back opening.

What is claimed is:

1. A method for forming an image sensor with passivated full deep-trench isolation, comprising:
    forming a plurality of trenches in a front surface of a semiconductor substrate, each of the plurality of trenches having a trench depth;
    filling the plurality of trenches with a sacrificial material;
    forming a plurality of photodiode regions in the semiconductor substrate, each pair of adjacent photodiode regions being separated by a trench of the plurality of trenches;
    forming a circuit layer disposed on the front surface of the semiconductor substrate; and
    thinning the semiconductor substrate by removing material from a back surface of the semiconductor substrate until the semiconductor substrate has a thickness less than the trench depth, the back surface being opposite the front surface; and
    removing the sacrificial material.

2. The method of claim 1, further comprising depositing a first dielectric material onto the back surface and into the plurality of trenches forming a passivation layer.

3. The method of claim 1, further comprising depositing a second dielectric material onto the back surface and into the plurality of trenches forming an anti-reflective coating.

4. The method of claim 1, further comprising filling the plurality of trenches with a conductive material, wherein the conductive material comprises one or more of aluminum and tungsten.

5. The method of claim 1, further comprising filling the plurality of trenches with an oxide material.

6. The method of claim 5, wherein the step of filling the plurality of trenches with an oxide material comprises:
    depositing the oxide material into the plurality of trenches and onto the back surface; and
    planarizing the oxide material forming a buffer layer on the back surface.

7. The method of claim 1, further comprising forming an optics layer disposed on the back surface.

8. The method of claim 1, wherein the step of forming the plurality of trenches in the front surface of the semiconductor substrate further comprises:
    depositing, on the front surface, a photoresist pattern with a plurality of openings; and
    etching the semiconductor substrate through the plurality of openings to form the plurality of trenches in the semiconductor substrate, the width of each of the plurality of trenches decreasing with increasing distance from the front surface.

9. The method of claim 1, wherein the sacrificial material is one of silicon nitride and silicon carbide.

10. A method for reducing noise in an image sensor, comprising: removing material from a semiconductor substrate from a first surface to form a plurality of trenches that extends into the semiconductor substrate toward a second surface of the semiconductor substrate, wherein the second surface is opposite to the first surface; and depositing a dielectric material onto the second surface and into the plurality of trenches through an opening of each of the plurality of trenches, lining sidewall surfaces of each trench of the plurality of trenches, from the back opening proximate to the second surface.

11. The method of claim 10, the step of depositing further comprising depositing a high-κ dielectric material.

12. The method of claim 10, further comprising depositing a second dielectric material onto the second surface and into the plurality of trenches through the opening of each of the plurality of trenches forming an anti-reflective coating.

13. The method of claim 10, further comprising depositing a filling material into each of the plurality of trenches through the opening.

14. The method of claim 10, wherein a first trench width proximate the first surface is larger than a second trench width proximate the second surface.

* * * * *